(12) United States Patent
Kokaze et al.

(10) Patent No.: US 9,305,752 B2
(45) Date of Patent: Apr. 5, 2016

(54) METHOD FOR OPERATING SUBSTRATE PROCESSING APPARATUS

(75) Inventors: Yutaka Kokaze, Susono (JP); Masahisa Ueda, Susono (JP); Yoshiaki Yoshida, Susono (JP)

(73) Assignee: ULVAC, INC., Chigasaki-Shi (JP)

(*) Notice: Subject to any disclaimer, the term of this patent is extended or adjusted under 35 U.S.C. 154(b) by 0 days.

(21) Appl. No.: 13/414,953

(22) Filed: Mar. 8, 2012

(65) Prior Publication Data

US 2012/0193323 A1 Aug. 2, 2012

Related U.S. Application Data

(63) Continuation of application No. PCT/JP2010/065132, filed on Sep. 3, 2010.

(30) Foreign Application Priority Data

Sep. 9, 2009 (JP) ................................. 2009-208393

(51) Int. Cl.
*B44C 1/22* (2006.01)
*H01J 37/32* (2006.01)
*H01L 21/3213* (2006.01)

(52) U.S. Cl.
CPC ....... *H01J 37/32449* (2013.01); *H01J 37/3244* (2013.01); *H01L 21/32136* (2013.01)

(58) Field of Classification Search
USPC .......................................................... 216/67
See application file for complete search history.

(56) References Cited

U.S. PATENT DOCUMENTS

| 4,680,085 A | * | 7/1987 | Vijan et al. ..................... 438/482 |
| 5,776,356 A | * | 7/1998 | Yokoyama et al. ............. 216/76 |
| 6,100,100 A | | 8/2000 | Nagano et al. |
| 2009/0159214 A1 | | 6/2009 | Kasai |

(Continued)

FOREIGN PATENT DOCUMENTS

| CN | 101385129 | 3/2009 |
| JP | 08-008232 | 1/1996 |

(Continued)

OTHER PUBLICATIONS

Espacenet, JP2009194194 translation, Oct. 22, 2013, Expacenet, p. 1-12.*

(Continued)

*Primary Examiner* — Binh X Tran
*Assistant Examiner* — David A Cathey, Jr.
(74) *Attorney, Agent, or Firm* — Kratz, Quintos & Hanson, LLP

(57) ABSTRACT

A method for operating a substrate processing apparatus is provided which can contain generation of particles by generating plasma in a stable manner. After a substrate is disposed in an evacuated vacuum chamber, a rare gas is initially supplied into the vacuum chamber, a voltage is applied to a plasma generating means, and plasma of the rare gas is generated. Subsequently, a reaction gas is supplied into the vacuum chamber, the reaction gas is brought into contact with the plasma of the rare gas, and plasma of the reaction gas is generated. The plasma of the reaction gas is brought into contact with the substrate; and the substrate is processed. Plasma is stably generated not by turning the reaction gas into plasma but by first turning the rare gas into plasma by the plasma generating means, and generation of particles is subsequently suppressed.

10 Claims, 2 Drawing Sheets

(56) References Cited

U.S. PATENT DOCUMENTS

2013/0183445 A1* 7/2013 Rahtu et al. ............... 427/249.17
2014/0066838 A1* 3/2014 Hancock ......................... 604/23

FOREIGN PATENT DOCUMENTS

| JP | 8-269445 | 10/1996 |
| JP | 10-12836 | 1/1998 |
| JP | 2004-363316 A1 | 12/2004 |
| JP | 2009-194194 A1 | 8/2009 |

OTHER PUBLICATIONS

Espacenet, JP2009194194 translation, Dec. 2, 2014, Espacenet, p. 1-12.*
International Search Report for International Application No. PCT/JP2010/065132 dated Nov. 22, 2010.
Japanese Office Action dated Jun. 24, 2014, in the corresponding Japanese patent application No. 2011-530822, with English translation.

* cited by examiner

METHOD FOR OPERATING SUBSTRATE PROCESSING APPARATUS

This application is a continuation of International Application No. PCT/JP2010/065132, filed on Sep. 3, 2010, which claims priority to Japan Patent Application No. 2009-208393, filed on Sep. 9, 2009. The contents of the prior applications are herein incorporated by reference in their entireties.

BACKGROUND OF THE INVENTION

1. Field of the Invention

The present invention generally relates to a method for operating a substrate processing apparatus.

2. Description of the Background Art

Piezoelectric elements, developed and currently put into practical use in a sensor, an actuator, a transmitter, an RF filter or the like and Ferroelectric Random Access Memory (Fe-RAM), used as a nonvolatile memory in various types of IC cards, hand-held terminals or the like, both have a structure in which a ferroelectric thin film is sandwiched by precious metal electrodes.

For microfabrication of the ferroelectric thin films and precious metal electrodes, a dry etching method with the use of a plasma is used, but ferroelectric thin films and precious metal electrodes are regarded as difficult etching materials and are poor in reactivity with halogen gas (plasma). Since these halogenated substances have low vapor pressures, it is likely that etched products are not exhausted as gas but adhere to the inner wall of a chamber.

When ions in the plasma are brought into contact with such adherent substances, they may react with each other, causing the adherent substances to be peeled off from the inner wall of the chamber to generate particles. Such generated particles adhere onto a substrate to be processed and have reduced device yield.

See, Japanese Patent Document JP-A 8-269445.

SUMMARY OF THE INVENTION

The inventors have focused attention on the fact that, when plasma immediately after generation become unstable, ions in the plasma react with adherent substances and the generation of particles occurs, which made the inventors recognize and study the importance of how to generate plasma is a stable manner and thus made the present invention.

The present invention was created in order to solve the disadvantages of the above-described conventional technology and has an object to provide a method for operating a substrate processing apparatus which can stably generate plasma and can contain the generation of particles.

In order to achieve the above-described object, the present invention is directed to a method for operating a substrate processing apparatus having a vacuum chamber; a vacuum evacuation part for evacuating the inside of the vacuum chamber; a gas supplying part for supplying a gas into the vacuum chamber; and a plasma generating part for generating plasma of the gas inside the vacuum chamber by applying a voltage to a plasma generating means, and processing a substrate by bringing plasma into contact with the substrate disposed inside the vacuum chamber. The method of the present invention includes the steps of a plasma ignition step of supplying a rare gas into the vacuum chamber and generating a plasma of the rare gas by applying a voltage to the plasma generating means; and a plasma processing step of supplying a reaction gas into the vacuum chamber to bring the reaction gas into contact with the plasma of the rare gas to generate a plasma of the reaction gas, and bringing the plasma of the reaction gas into contact with the substrate to process the substrate.

The present invention is directed to the method for operating a substrate processing apparatus, wherein a pressure inside the vacuum chamber when the plasma is generated in the plasma ignition step is higher than the pressure in the vacuum chamber when the processing of the substrate is started in the plasma processing step.

The present invention is directed to the method for operating a substrate processing apparatus wherein a supply flow rate of the rare gas into the vacuum chamber when the plasma is generated in the plasma ignition step is larger than the supply flow rate of the rare gas into the vacuum chamber when the processing of the substrate is started in the plasma processing step.

The present invention is directed to the method for operating a substrate processing apparatus, wherein the rare gas includes any one kind of gases selected from a group consisting of He, Ne, Ar, Kr and Xe.

The present invention is directed to the method for operating a substrate processing apparatus wherein in the plasma processing step, the substrate is etched by bringing the plasma of the reaction gas into contact with the substrate.

The present invention is directed to the method for operating a substrate processing apparatus, wherein the substrate has an electrode film formed of conductive material and a ferroelectric film formed of ferroelectric material; and in the plasma processing step, either one of or both of the electrode film and the ferroelectric film are etched by bringing the plasma of the reaction gas into contact with the substrate.

The present invention is directed to the method for operating a substrate processing apparatus, wherein the electrode film includes at least one kind of conductive material in a group of conductive materials consisting of Pt, Ir, $IrO_2$ and $SrRuO_3$.

The present invention is directed to the method for operating a substrate processing apparatus, wherein the ferroelectric film includes any one kind of ferroelectric material selected from a group consisting of barium titanate ($BaTiO_3$), lead titanate ($PbTiO_3$), bismuth lanthanum titanate(($Bi,La)_4Ti_3O_{12}$:BLT), lead zirconate titanate($Pb(Zr,Ti)O_3$:PZT), lead lanthanum zirconate titanate (($PbLa)(ZrTi)O_3$:PLZT), and strontium bismuth tantalate ($SrBi_2Ta_2O_3$:SBT).

The present invention is directed to the method for operating a substrate processing apparatus, wherein the reaction gas includes a gas which has, in the chemical structure thereof, any one kind of halogen element selected from a group consisting of fluorine, chlorine, bromine, and iodine.

The present invention is directed to the method for operating a substrate processing apparatus, wherein during the processing of the substrate in the plasma processing step, the substrate is heated or cooled so as to be at a temperature of 250° C. or more.

Effects of the Invention

Since plasma, immediately after generation, is stabilized so as to reduce the amount of generated particles, the product yield is improved.

DETAILED DESCRIPTION OF THE PREFERRED EMBODIMENTS BEST MODE FOR CARRYING OUT THE INVENTION

<Structure of Substrate Processing Apparatus>

As an example of a substrate processing apparatus used in the present invention, an etching apparatus on which an inductively coupled plasma (ICP) source is mounted will hereinafter be described.

Figure 1:
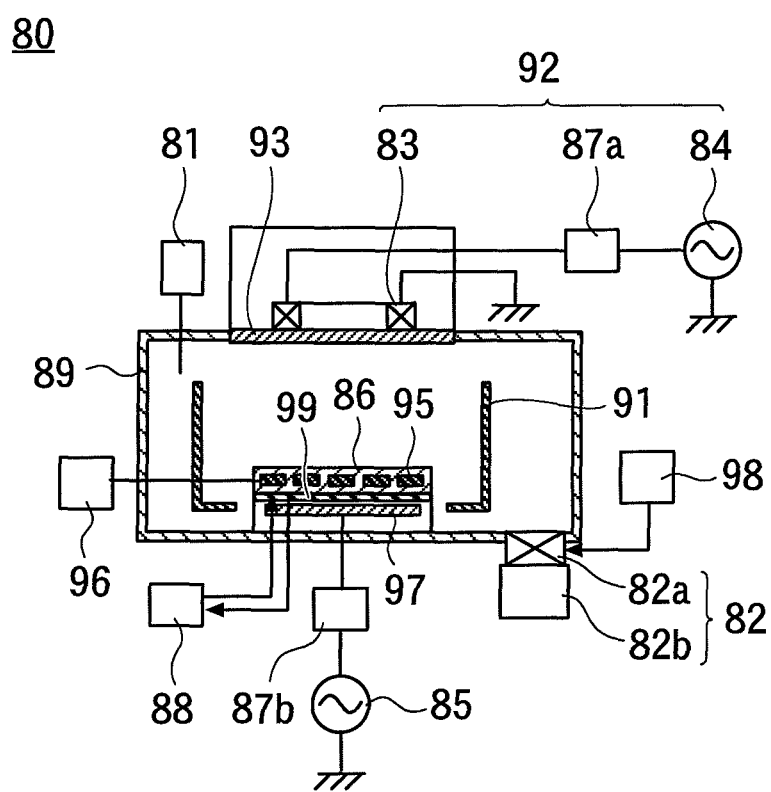
FIG. 1 is a diagram for illustrating the structure of an etching apparatus.

Reference numeral 80 in FIG. 1 denotes the etching apparatus.

The etching apparatus 80 has a vacuum chamber 89, a plasma generating part 92, a gas supplying part 81, a vacuum evacuation part 82, and a temperature control part 88.

Inside the vacuum chamber 89, a stage 86 for placing a substrate thereon is provided. In the stage 86, an electrode 95 is provided, and a DC power source for chuck 96 is electrically connected to this electrode 95. The stage 86 is configured such that if a DC voltage is applied to the electrode 95 from the DC power source for chuck 96, the substrate placed on the stage 86 is electrostatically adsorbed and held.

The temperature control part 88 is connected to the stage 86; and by controlling a heater 99 provided in the stage 86 with a heat conductive medium (such as, He gas) being made to flow between the stage 86 and the substrate which is an object to be processed, the substrate being an object to be processed placed on the stage 86 can be heated or cooled to a predetermined temperature.

In a top portion (ceiling portion) of the vacuum chamber 89, an RF introduction window 93 made of quartz, alumina or the like is provided such that electric waves can be transmitted through from the outside of the vacuum chamber 89 to the inside.

The plasma generating part 92 has an RF antenna 83 as plasma generating means, a matching box 87a, and an AC power source for plasma 84. The RF antenna 83 is placed above the RF introduction window 93 and is electrically connected to the AC power source for plasma 84 via the matching box 87a. If an AC voltage is applied to the RF antenna 83 from the AC power source for plasma 84, electric waves are radiated from the RF antenna 83 into the vacuum chamber 89, transmitted through the RF introduction window 93, thereby an etching gas supplied into the vacuum chamber 89 can be turned into a plasma state.

Also, an AC power source for sputtering 85 is electrically connected to the electrode 97 provided on the stage 86 via a matching box 87b. When an AC voltage is applied to the electrode 97 on the stage 86 from the AC power source for sputtering 85, ions in the plasma are accelerated to impact against the substrate on the stage 86; thus, the substrate can be etched.

The gas supplying part 81 and the vacuum evacuation part 82 are both arranged outside of the vacuum chamber 89. The vacuum evacuation part 82 has a pressure control valve 82a and a vacuum pump 82b; and the vacuum pump 82b is connected to the inside of the vacuum chamber 89 via the pressure control valve 82a so that the inside of the vacuum chamber 89 can be evacuated to vacuum. The gas supplying part 81 is connected to the inside of the vacuum chamber 89 thereby an etching gas can be supplied into the vacuum chamber 89.

<Operation Method of the Substrate Processing Apparatus>

A method for operating a substrate processing apparatus, which is the present invention, will be described with the use of the above-described etching apparatus 80.

Here, a substrate on which an Ir thin film is formed on a face directed upward is used as an object to be processed.

First, the inside of the vacuum chamber 89 have been evacuated to vacuum by the vacuum evacuation part 82 in advance. In the subsequent processing steps, the vacuum evacuation part 82 continues to evacuate to vacuum the inside of the vacuum chamber 89.

The substrate is carried into the vacuum chamber 89 by a carry-in device which is not illustrated in the drawings, while the vacuum atmosphere in the vacuum chamber 89 is maintained; and a face opposite to the face on which the Ir thin film is formed is brought into contact with the stage 86 to arrange the substrate on the stage 86 with a side having the formed Ir thin film exposed. A DC voltage is applied to the electrode 95 provided on the stage 86 from the DC power source for chuck 96; thus, the substrate is held on the stage 86 by electrostatic adsorption.

Next, as a plasma igniting step, a rare gas is supplied into the vacuum chamber 89 from the gas supplying part 81.

As the rare gas, Ar gas is used here. The rare gas to be used in the present invention is preferably Ar gas due to price, availability or the like, yet is not limited as such, and gas such as He, Ne, Kr, Xe or the like can be used.

Exhaust conductance of the pressure control valve 82a is controlled by a controller 98; and the pressure inside the vacuum chamber 89 is controlled to a predetermined pressure. The pressure at this time is varied depending on the structure of the RF antenna 83, the capacity of the vacuum chamber 89, a supply throughput of the rare gas or the like, but it is preferably within a range of 3 to 10 Pa, in which plasma immediately after generation is stabilized at the utmost (A to B means A or more and B or less).

After the pressure in the vacuum chamber 89 is stabilized, the AC power source for plasma 84 is activated to make an AC current flow through the RF antenna 83; and the electric waves are radiated from the RF antenna 83 into the vacuum chamber 89, transmitted through the RF introduction window 93; thus the plasma of the rare gas is generated.

A reaction gas, which is later described, is a polyatomic molecular gas, of which plasma contains a positive ion and a negative ion, while the rare gas is a monoatomic molecular gas and its plasma does not contain a negative ion. Therefore, even if an etched product has already adhered to the RF introduction window 93, in the case of the plasma of the rare gas, negative ions are never brought into contact and react with the etched product to result in exfoliation of the etched product off the RF introduction window 93, whereby generation of particles is inhibited.

Thereafter, until the etching processing is finished, electric power is continuously applied from the AC power source for plasma 84 to the RF antenna 83 so that the plasma of the rare gas is maintained.

Next, the exhaust conductance of the pressure control valve 82a is increased, in order to lower and control the pressure inside the vacuum chamber 89 to a predetermined pressure lower than the pressure at the plasma generation in the plasma igniting step. The pressure at this time is preferably within a range of 0.2 to 3 Pa, which is the pressure for etching the substrate.

The substrate is heated or cooled to a predetermined temperature by controlling the heater 99 provided in the stage 86, while the temperature control part 88 is activated to make the heat conductive medium (such as, He or the like) flow between the stage 86 and the substrate.

As the temperature of the substrate, etching can be performed even at a temperature in the vicinity of a room temperature, but if a conductive material with a low vapor pressure of a halogenated substance, a ferroelectric material or the like is to be etched, the substrate is preferably heated or cooled to 250° C. or more or more particularly to approximately 300° C.

After the pressure in the vacuum chamber 89 is stabilized, as a plasma processing step in this embodiment, the supply flow rate of the rare gas into the vacuum chamber 89 is decreased; supply of the reaction gas is started; the reaction gas is brought into contact with the plasma of the rare gas so as to turn the reaction gas into a plasma state; and an active species (such as, ions and radicals of the reaction gas) is generated to bring the active species into contact with the Ir thin film of the substrate.

As the reaction gas, a mixture gas of $Cl_2$ gas and $O_2$ gas is used.

The reaction gas of the present invention is not limited by that; and the reaction gas may include gas that is capable of etching substrates, such as a halogen based gas, which includes any one halogen element selected from a group consisting of fluorine, chlorine, bromine, and iodine in the chemical structure thereof.

In this embodiment, supply of the reaction gas is started after the supply flow rate of the rare gas is decreased, but the supply flow rate of the rare gas may be decreased after the supply of the reaction gas is started.

When the rare gas is not required for etching, the supply of the rare gas may be stopped.

Also, the pressure inside the vacuum chamber 89 may be controlled so as to be a predetermined pressure, even after the supply of the reaction gas is started, by increasing the exhaust conductance of the pressure control valve 82a without decreasing the supply flow rate of the rare gas.

After the gas supply flow rate and the pressure in the vacuum chamber are respectively stabilized, the AC power source for sputtering 85 is activated, an AC voltage is applied to the electrode 97 provided on the stage 86 so that the ions in the plasma enter the Ir thin film on the substrate, thereby etching processing is started.

This means that the pressure in the vacuum chamber 89 when generating plasma in the plasma ignition step is higher than the pressure in the vacuum chamber 89 when starting the substrate processing in the plasma processing step. Also, the supply flow rate of the rare gas into the vacuum chamber 89 when generating the plasma in the plasma ignition step is larger than the supply flow rate of the rare gas into the vacuum chamber 89 when starting the substrate processing in the plasma processing step.

An etched product, generated by the reaction of the Ir thin film with the plasma of the reaction gas, evaporates or is sputtered by the incident ions to be gasified so as to be removed by vacuum evacuation.

Since the halogenated substance of Ir has a low vapor pressure, apart of the etched product is not exhausted as gas but adheres to a shield 91 disposed so as to surround the stage 86, the RF introduction window 93 or the like inside of the chamber.

In this embodiment, the shield 91 is provided in order to prevent the etched product from adhering to the inner wall of the vacuum chamber 89.

After the Ir thin film is etched to a predetermined film thickness, outputs of the AC power source for plasma 84 and the AC power source for sputtering 85 are stopped, respectively, and supply of the reaction gas from the gas supplying part 81 is also stopped. Also, introduction of the rare gas from the temperature control part 88 is stopped; and vacuum adsorption of the stage 86 is removed.

Next, while the vacuum atmosphere in the vacuum chamber 89 is maintained, the etched substrate is taken out by a carry-out device, which is not illustrated in the drawings.

In this embodiment, the substrate on which the Ir thin film has been formed is subjected to the etching processing, but the object to be processed in the present invention is not limited by it; and an object to be processed, in which an electrode film being formed of a conductive material (such as, Pt, Ir, $IrO_2$, $SrRuO_3$) of which vapor pressure is low when it is a halogenated substance, and a ferroelectric film formed of ferroelectric material (such as, barium titanate ($BaTiO_3$), lead titanate ($PbTiO_3$), bismuth lanthanum titanate(($Bi,La)_4Ti_3O_{12}$:BLT), lead zirconate titanate ($Pb(Zr,Ti)O_3$:PZT), lead lanthanum zirconate titanate (($PbLa)(ZrTi)O_3$:PLZT), and strontium bismuth tantalate ($SrBi_2Ta_2O_3$:SBT)), of which vapor pressure is low when it is a halogenated substance, are laminated on the substrate in an order of an electrode film and a ferroelectric film as a piezoelectric element may be subjected to etching processing.

In other words, either one of or both of the electrode film and the ferroelectric film may be subjected to the etching processing.

The substrate processing apparatus used in the present invention is not limited to the etching apparatus as described above, but an apparatus, which processes a substrate by generating plasma in the vacuum chamber as a plasma CVD apparatus, a plasma ashing apparatus, may be used.

The plasma source of the substrate processing apparatus used in the present invention is not limited to the above-described inductively-coupled type (ICP) but a plasma source of a capacitively-coupled type (CCP), an electron cyclotron resonance type (ECR), a helicon-wave excited type or the like may also be used.

EXAMPLE

Example 1

A Ø8-inch substrate (a substrate having a diameter of 20 cm) on which an Ir thin film is formed on a face directed upward was carried into the vacuum chamber 89, which was evacuated to vacuum, of the etching apparatus 80 to be disposed on the stage 86 with the Ir thin film exposed.

A DC voltage of ±800V was applied from the DC power source for chuck 96 to the electrode 95 provided in the stage 86 so as to electrostatically adsorb the substrate onto the stage 86. While a He gas was made to flow with the pressure of 800 Pa between the stage 86 and the substrate, the substrate was temperature-controlled to the temperature of 300° C.

Secondly, an Ar gas was supplied into the vacuum chamber 89, and the pressure in the vacuum chamber 89 was set to 7 Pa. After the pressure in the vacuum chamber 89 was stabilized, electric power of 1600 W was applied to the RF antenna 83 from the AC power source for plasma 84 so as to generate plasma of the Ar gas.

This was followed by the pressure in the vacuum chamber 89 being lowered to 0.5 Pa by controlling the pressure control valve 82a.

Next, the supply flow rate of the Ar gas was decreased, and the supply of a $Cl_2$ gas and an $O_2$ gas was started to have the supply flow ratio of Ar:$Cl_2$:$O_2$ gas become 1:4:2. The gas supplied into the vacuum chamber 89 contacted with the plasma and turned into a plasma state.

Thereafter, an AC voltage of 300 W was applied to the electrode 97 provided on the stage 86 from the AC power source for sputtering 85 to let the ions in the plasma enter the substrate to have the Ir thin film become etched.

After etching for a predetermined time, outputs of the AC power source for plasma 84 and the AC power source for sputtering 85 were stopped; respectively, and supply of the reaction gas from the gas supplying part 81 was also stopped. Further, introduction of the He gas from the temperature control part 88 was stopped; and the vacuum adsorption of the stage 86 was removed.

While the vacuum atmosphere in the vacuum chamber 89 was maintained, the substrate after etching was taken out of the vacuum chamber 89; and then, the number of particles on the substrate was measured.

The above-described processing step was repeated by using a plurality of substrates one by one. Accordingly, the etched product was removed from the inside of the vacuum chamber 89 before the first substrate was carried in, but the etched product was not removed from the inside of the vacuum chamber 89 for the second and following substrates.

Comparative Example 1

A Ø8-inch substrate (a substrate having a diameter of 20 cm) on which an Ir thin film is formed on the face directed upward was carried into the vacuum chamber 89, having vacuum-evacuated, of the etching apparatus 80 to be disposed on the stage 86 with the Ir thin film exposed.

A DC voltage of ±800V was applied from the DC power source for chuck 96 to the electrode 95 provided in the stage 86 so as to electrostatically adsorb the substrate to the stage 86. While a He gas was made to flow with the pressure of 800 Pa between the stage 86 and the substrate, the substrate was temperature-controlled to the temperature of 300° C.

Secondly, an Ar gas, a $Cl_2$ gas, and an $O_2$ gas were supplied in the flow ratio of 1:4:2 into the vacuum chamber 89, and the pressure in the vacuum chamber 89 was made to 7 Pa. After the pressure in the vacuum chamber 89 was stabilized, electric power of 1600 W was applied to the RF antenna 83 from the AC power source for plasma 84 so as to generate plasma of the gas in the vacuum chamber 89.

Then, by controlling the pressure control valve 82*a*, the pressure in the vacuum chamber 89 was lowered to 0.5 Pa.

An AC voltage of 300 W was applied to the electrode 97 provided on the stage 86 from the AC power source for sputtering 85 to have the ions in the plasma enter the substrate so that the Ir thin film was etched.

After etching for the same predetermined time as in Example 1, outputs of the AC power source for plasma 84 and the AC power source for sputtering 85 were stopped, respectively; and supply of the reaction gas from the gas supplying part 81 was also stopped. Further, the introduction of the He gas from the temperature control part 88 was stopped; and the vacuum adsorption of the stage 86 was removed.

While the vacuum atmosphere in the vacuum chamber 89 was maintained, the etched substrate was taken out of the vacuum chamber 89; and then, the number of particles on the substrate was measured.

The above-described processing step was repeated by using a plurality of substrates one by one. In this regard, the etched product was removed from the inside of the vacuum chamber 89 before the first substrate was carried in, but the etched product was not removed from the inside of the vacuum chamber 89 for the second and following substrates.
<Change of the Number of Particles>

Figure 2:
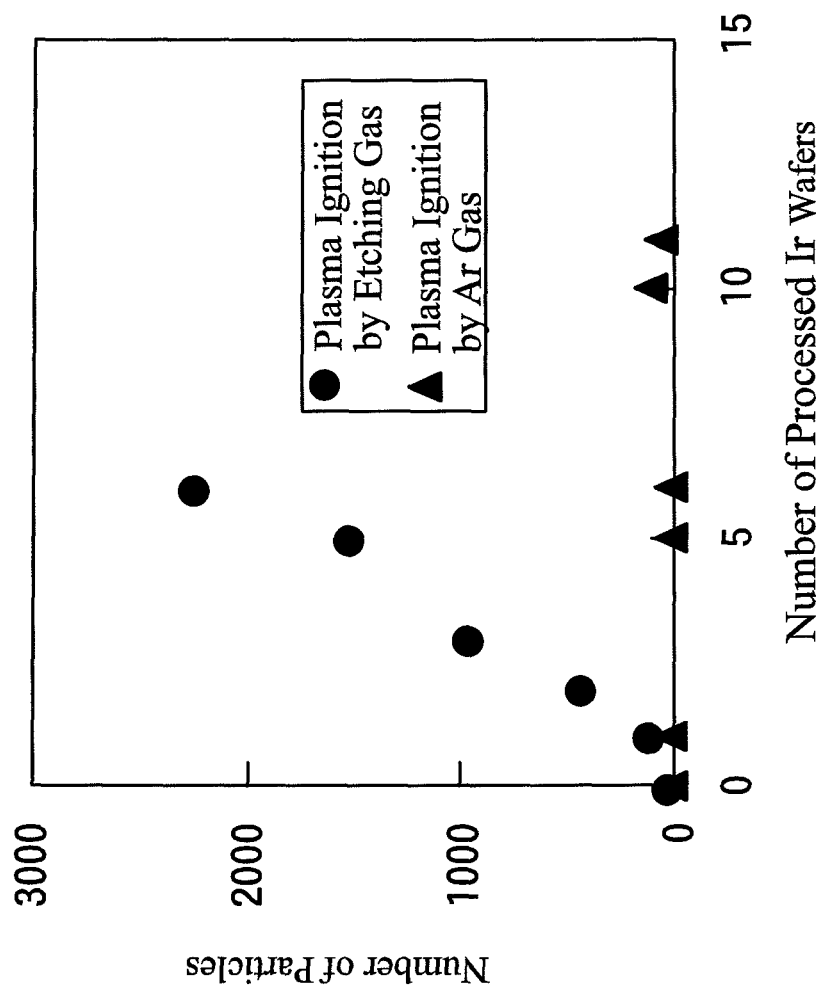
FIG. 2 is a diagram showing a transition of the number of particles on a substrate with respect to the number of processed substrates.

FIG. 2 illustrates changes of the number of particles on the substrate after etching, with respect to the number of processed substrates in Example 1 (plasma ignition by Ar gas) and in Comparative Example 1 (plasma ignition by etching gas), respectively.

In Comparative Example 1, the number of particles was increased with the number of processed substrates, but in Example 1, the number of particles remained extremely small even after a plurality of the substrates has been processed.

The reason why this is so is because when plasma is generated by etching gas, negative ions (such as, $Cl^-$ or $O^-$) in the plasma immediately after the generation contact with an etched product adhering to the RF introduction window 93 to react to generate particles. On the other hand, when the plasma is generated by Ar gas, since Ar gas is a monoatomic molecular gas, the plasma does not contain negative ions, thereby resulting in the desired stability.

What is claimed is:

1. A method for operating a substrate processing apparatus having a vacuum chamber; a vacuum evacuation part for evacuating the inside of the vacuum chamber; a gas supplying part for supplying a gas into the vacuum chamber; and a plasma generating part for generating plasma of the gas inside the vacuum chamber by applying a voltage to a plasma generating means, and processing a substrate by bringing plasma into contact with the substrate disposed inside the vacuum chamber, the method comprising the steps of:
   a plasma ignition step of supplying only a rare gas into the vacuum chamber and generating a plasma of the rare gas by applying a voltage to the plasma generating means; and
   a plasma processing step of supplying a reaction gas into the vacuum chamber while maintaining the plasma of the rare gas to bring the reaction gas into contact with the plasma of the rare gas to generate a plasma of the reaction gas, and bringing the plasma of the reaction gas into contact with the substrate to process the substrate,
   wherein the plasma generating means is a radio frequency antenna applied through a radio frequency window,
   wherein the plasma processing step is an etching step,
   wherein the plasma of the rare gas is maintained during substantially the entirety of the plasma processing step by continuously supplying the rare gas and by continuously applying the voltage to the plasma generating means, and
   wherein a pressure inside the vacuum chamber when the plasma is generated in the plasma ignition step is higher than a pressure inside the vacuum chamber when the substrate processing starts in the plasma processing step.

2. The method for operating a substrate processing apparatus according to claim 1,
   wherein a pressure inside the vacuum chamber when the plasma is generated in the plasma ignition step is higher than the pressure in the vacuum chamber when processing of the substrate is started in the plasma processing step.

3. The method for operating a substrate processing apparatus according to claim 1 or claim 2,
   wherein a supply flow rate of the rare gas into the vacuum chamber, when the plasma is generated in the plasma ignition step, is larger than the supply flow rate of the rare gas into the vacuum chamber when processing of the substrate is started in the plasma processing step.

4. The method for operating a substrate processing apparatus according to claim 1,
   wherein the rare gas includes anyone kind of gases selected from the group consisting of He, Ne, Ar, Kr and Xe.

5. The method for operating a substrate processing apparatus according to claim 1,
   wherein in the plasma processing step, the substrate is etched by bring the plasma of the reaction gas into contact with the substrate.

6. The method for operating a substrate processing apparatus according to claim 5,
wherein the substrate has an electrode film formed of a conductive material and a ferroelectric film formed of ferroelectric material, and
wherein in the plasma processing step, at least one of the electrode film and the ferroelectric film is etched by bringing the plasma of the reaction gas into contact with the substrate.

7. The method for operating a substrate processing apparatus according to claim 6,
wherein the electrode film includes at least one kind of conductive material in a group of conductive materials consisting of Pt, Ir, IrO2 and SrRuO3.

8. The method for operating a substrate processing apparatus according to claim 6,
wherein the ferroelectric film includes any one kind of ferroelectric material selected from the group consisting of barium titanate (BaTiO3), lead titanate (PbTiO3), bismuth lanthanum titanate((Bi,La)4Ti3O12:BLT), lead zirconate titanate(Pb(Zr,Ti)O3:PZT), lead lanthanum zirconate titanate ((PbLa)(ZrTi)O3:PLZT), and strontium bismuth tantalate (SrBi2Ta2O3:SET).

9. The method for operating a substrate processing apparatus according to claim 5,
wherein the reaction gas includes a gas which has, in the chemical structure thereof, any one kind of halogen element selected from the group consisting of fluorine, chlorine, bromine, and iodine.

10. The method for operating a substrate processing apparatus according to claim 5,
wherein during the processing of the substrate in the plasma processing step, the substrate is heated or cooled so as to be at a temperature of at least 250° C.

* * * * *